United States Patent [19]

Diederich

[11] Patent Number: 4,600,563
[45] Date of Patent: Jul. 15, 1986

[54] PLASMA REACTOR WITH VOLTAGE TRANSFORMER

[75] Inventor: Perry Diederich, Fremont, Calif.

[73] Assignee: Psi Star Incorporated, Hayward, Calif.

[21] Appl. No.: 698,448

[22] Filed: Feb. 5, 1985

[51] Int. Cl.$^4$ .................. B01J 19/08; B01J 19/12
[52] U.S. Cl. .................. 422/186.29; 422/186.05; 422/186.06; 204/298; 156/345
[58] Field of Search .............. 422/186.05, 186.06, 422/186.29; 204/395; 156/345

[56] References Cited

U.S. PATENT DOCUMENTS

| | | | |
|---|---|---|---|
| 3,440,418 | 4/1969 | Piazza | 422/186.05 X |
| 3,514,393 | 5/1970 | Eisby | 422/186.05 X |
| 3,671,195 | 6/1972 | Bersin | 422/186.05 X |
| 3,816,196 | 6/1974 | La Combe | 422/186.05 X |
| 3,875,068 | 4/1975 | Mitzel | 422/186.05 |
| 4,182,646 | 1/1980 | Zajac | |
| 4,230,515 | 10/1980 | Zajac | 156/345 |
| 4,253,907 | 3/1981 | Parry | 422/186.05 X |
| 4,304,983 | 12/1981 | Pierfederici | 422/186.05 X |

OTHER PUBLICATIONS

"Design Criteria for Uniform Reaction Rates in an Oxygen Plasma", IEEE Transactions on Electron Devices, 24, p. 140, Feb. 1977.
"The Reduction of Photoresist Stripping Rates in an Oxygen Plasma by By-Product Inhibition and Thermal Mass", Journal of the Electrochemical Society, 124, p. 147, Jan. 1977.
"The Effects of Geometry on Diffusion Controlled Chemical Reaction Rates in a Plasma", Journal of the Electrochemical Society, 124, p. 437, Mar. 1977.
"The Ultimate By-Products of Stripping Photoresist in an Oxygen Plasma", Journal of the Electrochemical Society, 124, p. 1926, Dec. 1977.
"Techniques and Applications of Plasma Chemistry", John R. Hollahan and Alexis T. Bell, chapter 9 Applications of Plasma Technology to the Fabrication of Semiconductor Devices by Ralph W. Kirk (New York, John Wiley & Sons, 1974).

*Primary Examiner*—Teddy S. Gron
*Assistant Examiner*—S. Wolffe
*Attorney, Agent, or Firm*—Limbach, Limbach & Sutton

[57] ABSTRACT

A plasma reactor comprises a working chamber, the chamber being adapted to receive at least one article and a volume of plasma which is capable of interacting with a material of the article. A pair of electrodes are positioned about the chamber. Further, a radio-frequency generator is provided. More particularly, the plasma reactor includes a radio-frequency voltage transformer. The transformer includes a primary winding that is connected to the generator and a secondary winding the center of which is grounded. The secondary winding is adapted to transform the energy received from the primary winding into plasma-exciting energy at the electrodes, whereby the voltage between the plasma and the ground is small such that voltage discharge between the plasma and any grounded parts is minimized.

4 Claims, 6 Drawing Figures

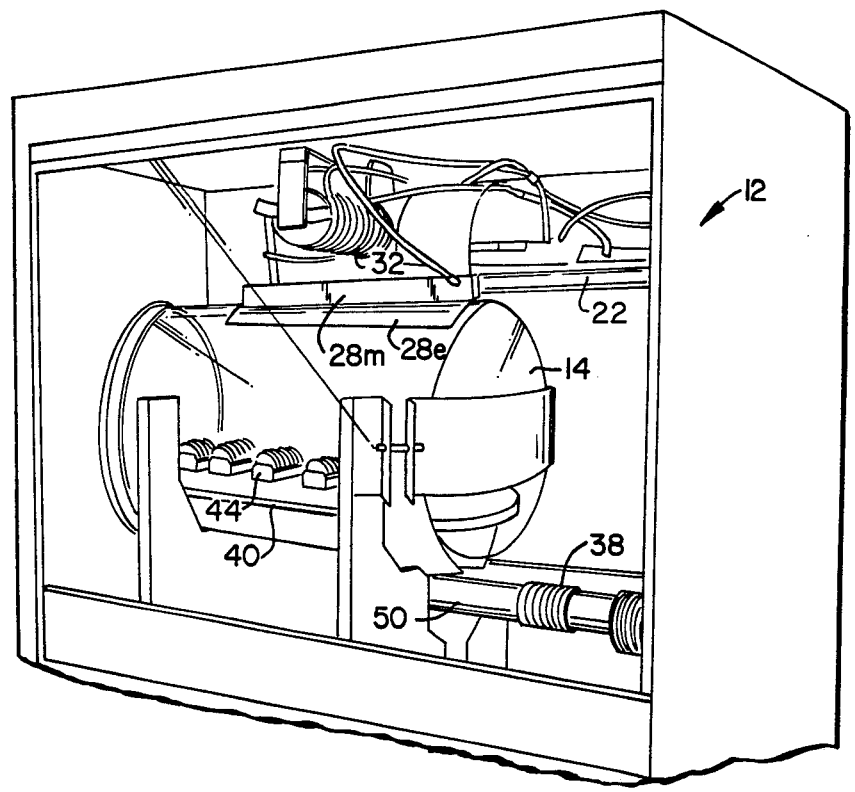
FIG._1.
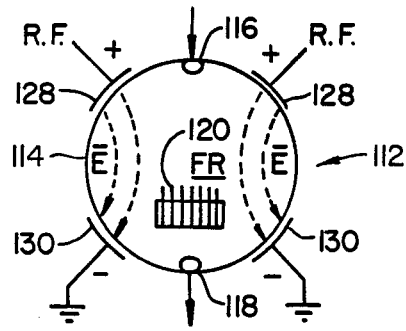
FIG._2A.
(PRIOR ART)
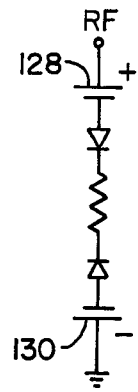
FIG._2B.
(PRIOR ART)

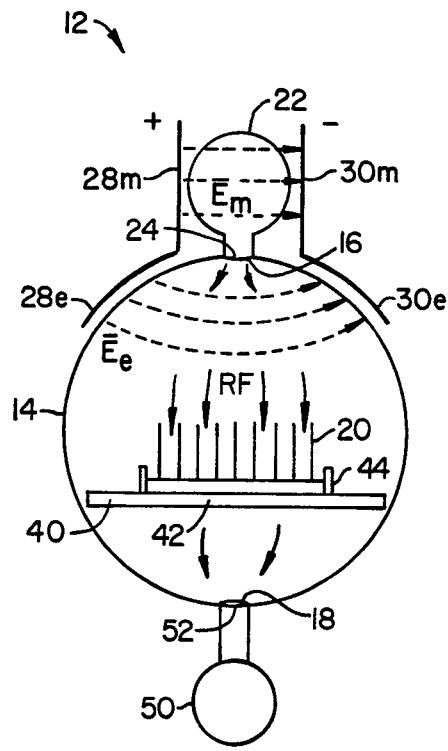
FIG._3.
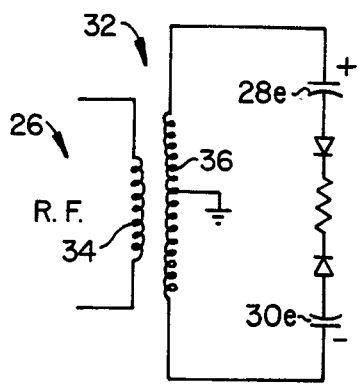
FIG._4.
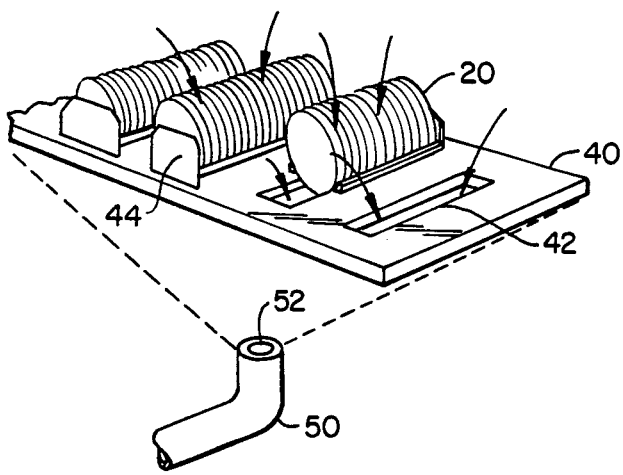
FIG._5.

PLASMA REACTOR WITH VOLTAGE TRANSFORMER

DESCRIPTION

1. Technical Field

This invention relates to plasma reactors, and more particularly, to plasma barrel reactors for removing the photoresist from semiconductor wafers or etching thin films such as aluminum, silicon dioxide, or pdlysilicon on silicon wafers patterned with photoresist ready for etching.

2. Background Art

The use of gas plasma for processing semiconductor wafers is common in the art. For example, various techniques are described in J. Hollahan and A. Bell, *Techniques and Applications of Plasma Chemistry*, Ch. 9 (1974).

Semiconductor components are fabricated on a semiconductive substrate or wafer. The material of the wafer is generally silicon. In manufacturing semiconductor devices, a photosensitive polymer, generally referred to as a photoresist, is used. After selective exposure to optical radiation and subsequent chemical development, the photoresist hardens where it has not been removed and protects the underlying wafer from other chemicals. The underlying material on the surface of the silicon wafer, which may be a thin film of aluminum, silicon dioxide, or polysilicon, is then pattern etched with a gas plasma such as carbon tetrafluorine with a small addition of oxygen.

One method of removing photoresist from wafers after it has served its protective function is by using a gas plasma.

In general, the gas plasma used in removing photoresist is oxygen. More particularly, diatomic oxygen is first exposed to an electric field which transforms some of the diatomic oxygen into an oxygen plasma that contains monoatomic oxygen, generally referred to as atomic oxygen. Atomic oxygen is capable of reacting with the photoresist by breaking its polymer chains such that the photoresist is removed from the semiconductor wafer by the combined action of the atomic oxygen and the molecular oxygen. The resultant by-products include gases such as $H_2O$, $CO$ and $CO_2$.

Prior art plasma reactors for removing photoresist, an example of which is shown in FIG. 2A, consist of a cylindrical quartz reactor. A plurality of semiconductor wafers, each of which has a layer of photoresist on its surfaces, are positioned within the reactor. Metal electrodes are positioned around the reactor, one of which is connected to a radio-frequency (RF) generator operating at 13.56 MHz or harmonics of that frequency and the other is connected to ground. The quartz reactor also includes a gas input port and an exhaust port.

Other prior art plasma reactors, not shown, include single-chamber reactor that has an electrode within the chamber, as best exemplified in U.S. Pat. No. 4,230,515. In addition, prior art reactors include double-chamber reactor in which the plasma is generated in one chamber and the work such as photoresist removal is performed in a second chamber. The plasma may be transported between the two chambers either through a narrow channel or through narrow tubes. The primary disadvantage of the double-chamber reactor is the likelihood of plasma degeneration before it could perform the removal of the photoresist, that is, atomic oxygen tends to recombine to diatomic oxygen on the walls of the channel or tubes.

A common occurrence in prior art reactors is the generation of discharges or arcing between the plasma and nearby metallic parts which are at electrical ground. As shown in FIG. 2B, the plasma reactor walls are equivalent, electrically, to two capacitors. The plasma generated within the reactor may be depicted as a resistor. The region within the plasma adjacent to the walls acts as two diodes whose forward direction points into the plasma. The resistance of the plasma is small compared to the resistance of the back biased diode. If, for example, the RF voltage connected to the first electrode is in the order of ±1,000 volts, approximately 450 volts are absorbed by each of the quartz barrel walls. This is due to the inherent property of quartz, which has the characteristics of a dielectric. This leaves approximately 100 volts across the plasma, most of which is across the back biased diode. When the RF voltage is at peak positive, the interior of the plasma is approximately +550 volts. Similarly, when the RF voltage is at peak negative, the interior of the plasma is approximately −450 volts. Thus, the voltage between the plasma and the ground is always roughly ±500 volts. This high voltage enhances the likelihood of arcing between the plasma and any grounded parts. For example, metal fittings on various parts which are connected to the reactor may be the targets of such arcing, resulting in the overheating and corrosion of those parts. In particular, the arcing may go to the fittings which connect the exhaust manifold to the pump. This arcing limits the amount of power that can be put into the plasma, and consequently, the rate at which the chemical reaction can take place and the capacity of the reactor.

DISCLOSURE OF THE INVENTION

In view of such deficiencies in the prior art, it is a major object of the present invention to provide a plasma reactor that is capable of minimizing the possibility of high-voltage arcing of the plasma to grounded parts other than the grounded electrodes.

In order to accomplish the above and still further objects, the present invention provides a plasma reactor. The plasma reactor comprises a working chamber that is adapted to receive at least one article and a volume of plasma which is capable of interacting with a material of the article.

A radio-frequency electrical energy generator is provided. A pair of electrodes are also positioned about the working chamber. The electrodes are adapted to create an electric field in the working chamber such that the electric field converts the working gas to a working plasma for interacting with a material of the article.

More particularly, a radio-frequency voltage transformer is provided. The transformer includes a primary winding that is connected to the generator and a secondary winding the center of which is grounded. Each end of the secondary winding is connected to one of the electrodes. Each electrode is capable of oscillating between ±500 volts. At peak voltage each capacitor, representing a reactor wall, has 450 volts across it. The interior of the plasma is connected to the forward biased diode, both ends of which are at about 50 volts. The back biased diode has about 100 volts across it. Thus, the interior of the plasma oscillates between 50 volts and ground twice every cycle. With 50 volts instead of 500 volts between the interior of the plasma and ground, there is a much less tendency for the plasma to arc to any grounded parts, thereby permitting more power to be put into the plasma.

Other objects, features, and advantages of the present invention will appear from the following detailed description of the best mode of a preferred embodiment, taken together with the accompanying drawings.

BRIEF DESCRIPTION OF THE DRAWINGS

FIG. 1 is a perspective view of the plasma barrel reactor of the present invention;

FIG. 2A is a partial, cross-sectional, and diagrammatical view of a prior art plasma reactor;

FIG. 2B is an electrical equivalent circuit of the prior art plasma reactor circuit;

FIG. 3 is a partial, cross-sectional, and diagrammatical view of the plasma barrel reactor of FIG. 1;

FIG. 4 is a schematic of the voltage transformer and an electrical equivalent circuit of the plasma barrel reactor of FIGS. 1 and 3; and FIG. 5 is a partial, cross-sectional, and diagrammatical view of the plasma flow constraint member of the plasma barrel reactor of FIGS. 1 and 3.

BEST MODE FOR CARRYING OUT THE INVENTION

Referring to FIG. 1, there is shown a plasma barrel reactor 12. Reactor 12 includes a generally barrel-like, cylindrical working chamber 14. Barrel chamber 14 may have a diameter from six to 12 inches; the diameter of chamber 14 is 12 inches in the preferred embodiment. The axial length of chamber 14 is approximately 21 inches. As best illustrated in FIG. 3, chamber 14 has a plurality of entry ports 16 for receiving a working gas and a plurality of exhaust ports 18 for venting various gases and by-products of chamber 14. There are four entry ports 16 and five exhaust ports 18 in the preferred embodiment. Moreover, entry ports 16 are positioned diametrically opposite exhaust ports 18. Chamber 14, in the preferred embodiment, is made from a conventional inert material such as quartz.

Chamber 14 is adapted to receive a plurality of articles 20. Articles 20, as shown, are semiconductor wafers each of which has a layer of photoresist material on it when the wafers are placed in chamber 14.

The photoresist may be present to define the areas of an underlying film which is to be etched. The film may be silicon dioxide, aluminum, or polysilicon, for example. Alternatively, the photoresist may be that which is left after the etching operation and which needs to be stripped.

Reactor 12 further includes an entry gas manifold 22 that is positioned adjacent chamber 14. Entry gas manifold 22 is a tube, also made of quartz, that has a plurality of ports 24 each of which is in communication with one of the barrel chamber entry ports 16. Entry gas manifold 22 in the preferred embodiment has four ports 24. Entry gas manifold 22 is capable of transporting the working gas to barrel chamber 14.

Referring now to FIG. 4, a radio-frequency (RF) electrical energy generator 26 is provided. In the preferred embodiment, the frequency of the RF energy is 13.56 MHz.

In addition, reactor 12 includes a pair of entry port electrodes 28e and 30e which are positioned adjacent barrel chamber entry ports 16, as best shown in FIG. 3. Each of the electrodes 28e and 30e, which are manufactured from a conductive metal such as copper, contains a slight curvature in its design such that it follows the curvature of chamber 14. Electrodes 28e and 30e are capable of creating an electric field in barrel chamber 14 adjacent entry ports 16. This entry port electric field $E_e$ then converts the working gas to a working plasma. Moreover, the position of entry port electric field $E_e$ delineates a substantially electric field-free region FR in chamber 14 adjacent articles 20.

A pair of manifold electrodes 28m and 30m, which are positioned adjacent entry gas manifold 22, is also provided. Each of the manifold electrodes 28m and 30m is a generally vertically-extending plate that is positioned at either side of manifold 22, as best shown in FIG. 3. Electrodes 28m and 30m are also manufactured from a conductive metal such as copper. Manifold electrodes 28m and 30m are capable of creating an electric field in manifold 22. The manifold electric field $E_m$ converts a portion of the working gas to the working plasma before the working gas enters chamber 14. The combined efforts of the manifold electric field $E_m$ and the entry port electric field $E_e$ efficaciously convert the working gas to the desired working plasma.

Although electrodes 28e and 28m and electrodes 30e and 30m are claimed and described as separate and discrete electrodes, electrodes 28e and 28m could be manufactured as a single electrode and electrodes 30e and 30m as a single electrode. In addition, manifold electrodes 28m and 30m need not be required in all instances. Although the manifold electric field $E_m$ generated by electrodes 28m and 30m does contribute to the efficacious conversion of the working gas to the working plasma, its elimination does not detract the overall conversion of the working gas to the working plasma made by the entry port electric field $E_e$ alone.

Reactor 12 further includes a radio-frequency voltage transformer 32, as shown in FIG. 4. Transformer 32 includes a primary winding 34 that is connected to RF generator 26 and a secondary winding 36 the center of which is grounded. One lead of secondary winding 36 is connected to electrodes 28e and 28m, and the other lead is similarly connected to electrodes 30e and 30m.

The advantage of using an RF voltage transformer to feed the RF energy to the electrodes is best contrasted to the prior art technique. As shown in FIG. 2A, a prior art plasma reactor 112 includes a quartz chamber 114 that has an entry gas port 116 and an exhaust port 118. A plurality of semiconductor wafers 120 are positioned within chamber 114. In addition, a pair of electrodes 128 and 130 are connected to an RF generator 126 and the ground, respectively. The equivalent circuit of reactor 112 is shown in FIG. 2B, in which the quartz walls of chamber 114 are represented as capacitors and the plasma is represented as a resistor. In addition, the region within the plasma adjacent to the walls acts as two diodes whose forward direction points into the plasma. The RF voltage provided to electrode 128 is in the order of +1000 volts. Due to the inherent properties of the quartz wall, which has the characteristics of a dielectric, approximately 450 volts are absorbed by the wall. This leaves approximately 100 volts across the plasma, most of which is across the back biased diode. The peak voltage between the plasma and ground is approximately ±500 volts. This high voltage between the plasma and ground causes discharges or arcing between the plasma and other metallic fittings of the reactor which are grounded such as the connections to the pump. Repeated arcing between a fitting and the plasma causes overheating of that fitting and corrodes and damages that fitting. This shorts out part of the electrical circuit and limits the power that can be put into the plasma.

In contrast, the use of RF voltage transformer 32 eliminates the enumerated disadvantages of the prior art reactor 112. In transformer 32, secondary winding 36, which is both center-tapped and grounded, permits the maximum voltage at either electrodes 28e, 28m or 30e, 30m to be +500 volts or −500 volts. With a voltage drop of 450 volts across the quartz wall, approximately +50 peak volts are presented in the plasma through the forward biassed diode. The voltage across the plasma swings between +50 volts and ground twice every cycle. This comparatively low voltage with respect to the ground minimizes the likelihood of arcing between the plasma and any metallic fittings such as fitting 38, as best shown in FIG. 1.

In the most recent designs, referring now to FIG. 5, reactor 12 also includes a plasma flow constraint member 40 that is positioned within barrel chamber 14. Constraint member 40 is a planar, board-like platform which has a plurality of openings 42 for receiving wafers 20. Wafers 20 are first placed into a conventional wafer receptacle 44, which is generally referred to as a wafer boat. Each wafer boat 44 is capable of receiving a plurality of wafers, as best shown in FIG. 5. The wafers in boat 44 are spaced apart sufficiently so as to permit the gas to flow among them and react with them. Boat 44, which is manufactured from an inert material such as quartz, is then received in opening 42.

Reactor 12 further includes an exhaust manifold 50 that is positioned adjacent chamber 14. Exhaust manifold 50 is a tube, also made of quartz, that has a plurality of ports 52 each of which is in communication with one of the barrel chamber exhaust ports 18. Exhaust manifold 50 of the preferred embodiment has five ports 52. Exhaust manifold 50 is capable of transporting away from chamber 14 any remaining working plasma along with gaseous by-products of the reaction.

In use, wafer boats 44 each of which that has a plurality of wafers 20 are first placed in openings 42 of platform 40. Chamber 14 is then evacuated to a moderate vacuum, approximately 1/1000 of an atomosphere. The evacuation is accomplished by a conventional pump, not shown, that is connected to exhaust manifold 50. The working gas, is admitted to chamber 14 via entry gas manifold 22. A source of incoming gas, not shown, is connected to entry gas manifold 22.

The RF generator is then activated, causing electrodes 28e, 28m, 30e and 30m to generate electric fields in both entry gas manifold 22 and chamber 14. The electric fields produced, $E_e$ and $E_m$ create the working plasma. The electric field in manifold 22 converts a small portion of the working gas into plasma before the gas enters ports 16 of chamber 14. The remaining portion of the working gas is converted to plasma by the electric field that is adjacent entry chamber ports 16. The position of the entry port electric field $E_e$ forces all of the working gas to pass through the field, enhancing the conversion of gas to plasma.

The working plasma travels through chamber 14, passing through wafers 20. After the working plasma has performed its interaction, producing an assortment of by-products, both the working plasma and the by-products pass through platform openings 42 before they exit the barrel chamber via exhaust manifold 50.

It will be apparent to those skilled in the art that various modifications may be made within the spirit of the invention and the scope of the appended claims.

I claim:

1. In a plasma reactor comprising
 a working chamber which is adapted to receive at least one article and a volume of plasma which is capable of interacting with a material of said article;
 a pair of electrodes positioned about said chamber; and,
 a radio-frequency generator,
 wherein the improvement comprises a radio frequency voltage transformer which includes a primary winding connected to the radio-frequency generator through an impedance matching network and a secondary winding, the center of which is grounded, and which secondary winding is adapted to transform the energy received from the primary winding into plasma-exciting energy at the electrodes, whereby the voltage between the energy-excited plasma and any grounded members of the plasma reactor is about 50 volts such that the intensity of any arc discharge across said voltage is minimized.

2. The plasma reactor of claim 1 wherein said material of said article is photoresist.

3. The plasma reactor of claim 1 or 2 wherein said article is a semiconductor wafer.

4. The plasma reactor of claim 3 wherein said plasma consists of oxygen.

* * * * *

UNITED STATES PATENT AND TRADEMARK OFFICE
CERTIFICATE OF CORRECTION

PATENT NO. : 4,600,563

DATED : July 15, 1986

INVENTOR(S) : PERRY DIEDERICH

It is certified that error appears in the above—identified patent and that said Letters Patent is hereby corrected as shown below:

Column 1, line 11, delete "pdlysilicon" and substitute "polysilicon".

Signed and Sealed this

Eighteenth Day of November, 1986

*Attest:*

DONALD J. QUIGG

*Attesting Officer*   *Commissioner of Patents and Trademarks*